US010163505B2

(12) United States Patent
Lee et al.

(10) Patent No.: US 10,163,505 B2
(45) Date of Patent: *Dec. 25, 2018

(54) RRAM ARRAY WITH CURRENT LIMITING ELEMENT

(71) Applicant: Taiwan Semiconductor Manufacturing Co., Ltd., Hsin-Chu (TW)

(72) Inventors: Chia-Fu Lee, Hsinchu (TW); Yu-Der Chih, Hsin-Chu (TW); Hon-Jarn Lin, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/836,028

(22) Filed: Dec. 8, 2017

(65) Prior Publication Data
US 2018/0102171 A1 Apr. 12, 2018

Related U.S. Application Data

(63) Continuation of application No. 15/332,371, filed on Oct. 24, 2016.

(60) Provisional application No. 62/255,733, filed on Nov. 16, 2015.

(51) Int. Cl.
*G11C 13/00* (2006.01)

(52) U.S. Cl.
CPC ........ *G11C 13/0069* (2013.01); *G11C 13/004* (2013.01); *G11C 13/0023* (2013.01); *G11C 13/0026* (2013.01); *G11C 13/0038* (2013.01); *G11C 2013/0083* (2013.01); *G11C 2013/0088* (2013.01); *G11C 2213/79* (2013.01); *G11C 2213/82* (2013.01)

(58) Field of Classification Search
CPC ............ G11C 13/0069; G11C 13/0026; G11C 13/004; G11C 13/0023; G11C 13/0038; G11C 2013/0083; G11C 2213/82; G11C 2013/0088; G11C 2213/79
USPC ...................................................... 365/148
See application file for complete search history.

(56) References Cited

U.S. PATENT DOCUMENTS

| 7,894,236 | B2 | 2/2011 | Oh et al. |
| 7,978,497 | B2 | 7/2011 | Maejima |
| 8,576,606 | B2 | 11/2013 | Kunitake et al. |
| 8,773,887 | B1 * | 7/2014 | Naji ...................... G11C 11/165 365/148 |

(Continued)

OTHER PUBLICATIONS

Wouters, Dirk. "Resistive Switching Materials and Devices for Future Memory Applications." 43rd IEEE Semiconductor Interface Specialists Conference, Tutorial SISC San Diego, Dec. 5, 2012.

(Continued)

*Primary Examiner* — Tha-O H Bui
(74) *Attorney, Agent, or Firm* — Eschweiler & Potashnik, LLC

(57) ABSTRACT

A resistive random access memory (RRAM) circuit is provided. In some embodiments, the RRAM circuit has a plurality of RRAM cells. A bit-line decoder is configured to concurrently apply a forming signal to the plurality of RRAM cells. A current limiting element is configured to concurrently limit a current of the forming signal applied to the plurality of RRAM cells.

20 Claims, 5 Drawing Sheets

(56) References Cited

U.S. PATENT DOCUMENTS

| | | | |
|---|---|---|---|
| 2012/0153249 A1* | 6/2012 | Zhang | H01L 45/08 257/4 |
| 2012/0230085 A1 | 9/2012 | Kawai et al. | |
| 2013/0044534 A1 | 2/2013 | Kawai et al. | |
| 2015/0162530 A1 | 6/2015 | Wang et al. | |
| 2015/0269998 A1 | 9/2015 | Siau et al. | |

OTHER PUBLICATIONS

Siliconix. "FETs as Voltage-Controlled Resistors." Mar. 10, 1997.

Sekar, Deepak. "Resistive RAM: Technology and Market Opportunities." Invited talk from MonolithIC 3D Inc. at the IEEE Santa Clara Valley Electron Devices Society, 2010.

Chiu, et al. "Differential 2R Crosspoint RRAM for Memory System in Mobile Electronics with Zero Standby Current." EE241 Final Project Report, Spring 2013.

Pan, Feng. "Experimental and Simulation Study of Resistive Switches for Memory Applications." Electrical Engineering and Computer Sciences University of California at Berkeley Technical Report No. UCB/EECS-2013-38. May 1, 2013.

Dr. R. Jacob Baker. "Sensing Circuits for Resistive Memory," Boise State University College of Engineering. Retrieved May 17, 2016 from the following location: cmosedu.com/jbaker/papers/talks/Resistive_memory_sensing.pdf.

Lelmini, et al. "Resistive Switching. From Fundamentals of Nanoionic Redox Processes to Memristive Device Applications." pp. 1-14. Published by Wiley-VCH. Published in 2016. ISBN No. 978-3-527-33417-9. Retrieved from: https://books.google.com/books?id=GD1cCwAAQBAJ&pg=PA2&lpg=PA2&dq=ReRAM+read+operation&source=bl&ots=olwoLhBBbP&sig=Qelc9RwL9tMMHLKeRrj1iA1yJ54&hl=en&sa=X&ved=0ahUKEwj5xbej2-HMAhUozIMKHV4GBxAQ6AEIUTAG#v=onepage&q=ReRAM%read%operation&f=false.

Non-Final Office Action dated Mar. 9, 2017 for U.S. Appl. No. 15/332,371.

Notice of Allowance dated Aug. 16, 2017 for U.S. Appl. No. 15/332,371.

* cited by examiner

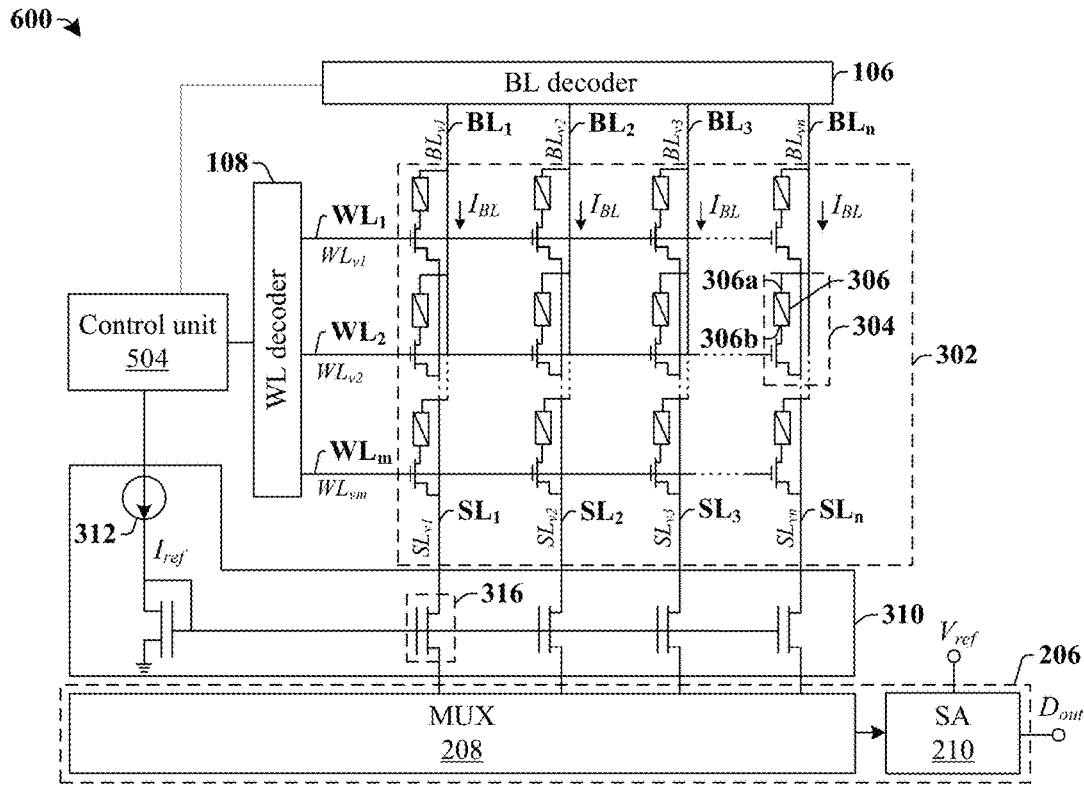

- 702 Activate word-line operably coupled to a row of RRAM devices
- 704 Apply a forming to a plurality of bit-lines coupled to first electrodes of the row of RRAM devices
- 706 Limiting currents on the plurality of bit-lines during a forming operation concurrent to the application of the forming voltage
  - 708 Apply bias signal to gate of a transistor devices connected to source-lines coupled to second electrode of the row of RRAM devices
- 710 Apply second voltage to plurality of source-lines to form initial conductive filaments within the RRAM devices

RRAM ARRAY WITH CURRENT LIMITING ELEMENT

REFERENCE TO RELATED APPLICATIONS

This application is a Continuation of U.S. application Ser. No. 15/332,371 filed on Oct. 24, 2016, which claims priority to U.S. Provisional Application No. 62/255,733 filed on Nov. 16, 2015. The contents of the above-referenced matters are hereby incorporated by reference in their entirety.

BACKGROUND

Many modern day electronic devices contain electronic memory configured to store data. Electronic memory may be volatile memory or non-volatile memory. Volatile memory stores data while it is powered, while non-volatile memory is able to store data when power is removed. Resistive random access memory (RRAM) is one promising candidate for next generation non-volatile memory technology. RRAM has a simple structure, consumes a small cell area, has a low switching voltage and fast switching times, and is compatible with CMOS fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-6B illustrate a block diagram and a timing diagram of some embodiments of a method of operating a RRAM circuit with a disclosed current limiting element.

FIG. 7 illustrates a flow diagram of some embodiments of a method of performing a forming operation on a RRAM circuit.

DETAILED DESCRIPTION

Figure 1:
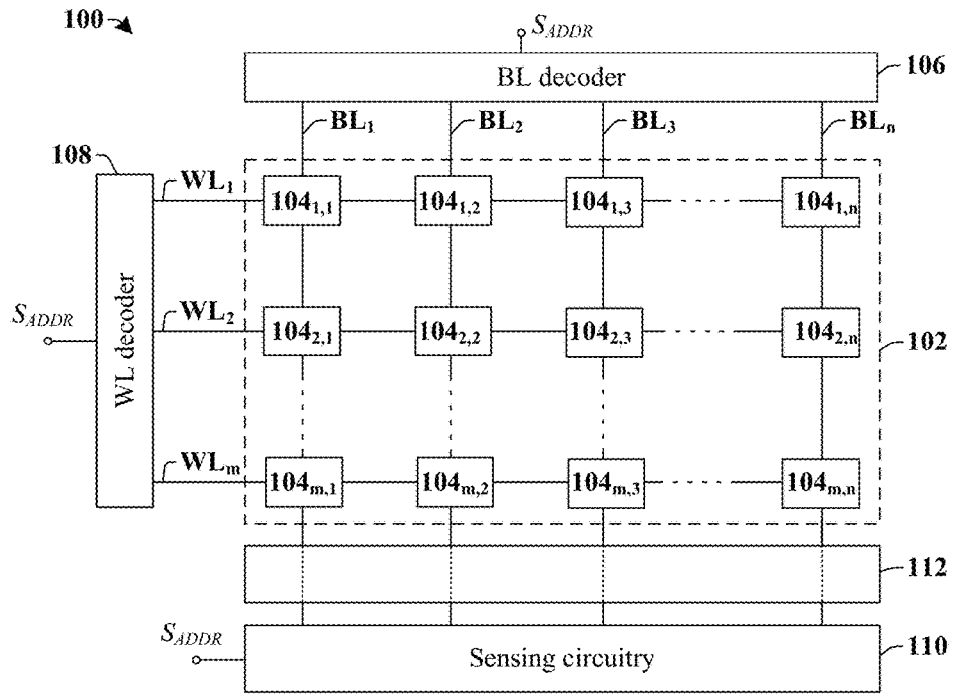
FIG. 1 illustrates some embodiments of a block diagram of a resistive random access memory (RRAM) circuit comprising a current limiting element configured to improve forming time.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive random access memory (RRAM) devices generally comprise a layer of high-k dielectric material arranged between conductive electrodes disposed within a back-end-of-the-line (BEOL) metallization stack. RRAM devices are configured to operate based upon a process of reversible switching between resistive states. This reversible switching is enabled by selectively forming a conductive filament through the layer of high-k dielectric material. For example, the layer of high-k dielectric material, which is normally insulating, can be made to conduct by applying a voltage across the conductive electrodes to form a conductive filament extending through the layer of high-k dielectric material. An RRAM cell having a first (e.g., high) resistive state corresponds to a first data value (e.g., a logical '0') and an RRAM cell having a second (e.g., low) resistive state corresponds to a second data value (e.g., a logical '1').

Before an RRAM device can be used to store data, an initial forming process is performed on RRAM cells within an RRAM array. The initial forming process forms a conductive filament within the layer of high-k dielectric material. Because the initial forming operation is performed on an entire RRAM array, it can be a time consuming process if done by individually applying a forming voltage/current to the RRAM cells. Alternatively, if the forming operation is concurrently performed on RRAM cells within multiple columns of an RRAM array, it can consume large currents, which may not be able to be provided to multiple columns at a same time due to limitations within an integrated circuit. For example, providing large forming currents to multiple columns may require a large pass gate transistor that consumes a large space on an integrated chip, while non-uniformities between RRAM cells and/or bit-lines can cause smaller forming currents to fail to provide enough current to each RRAM cell to effectively form a conductive filament.

The present disclosure relates to a resistive random access memory (RRAM) circuit comprising a current limiting element configured to improve a forming time of an RRAM array by limiting a current on a plurality of bit-lines and thereby allowing a forming operation to concurrently occur on RRAM devices coupled to the plurality of bit-lines, and an associated method. In some embodiments, the RRAM circuit comprises an RRAM array having a plurality of RRAM devices. A bit-line decoder is configured to concurrently apply a forming signal to a plurality of bit-lines coupled to two or more of the plurality of RRAM devices within a row of the RRAM array. A current limiting element is configured to concurrently limit a current of the forming signal on the plurality of bit-lines to below a forming value during a forming operation that forms conductive filaments within the RRAM device. By limiting the current on the bit-lines during the forming operation, the forming signal can concurrently be applied to multiple RRAM devices while maintaining a relatively low overall current consumption, thereby allowing the forming operation to be performed quickly and with a good uniformity.

FIG. 1 illustrates a block diagram of some embodiments of a resistive random access memory (RRAM) circuit 100 comprising a current limiting element configured to improve forming time.

The RRAM circuit 100 comprises a plurality of RRAM cells $104_{1,1}$-$104_{m,n}$ disposed within an integrated chip. The plurality of RRAM cells $104_{1,1}$-$104_{m,n}$ respectively comprise an RRAM device having a switchable resistive state. The RRAM cells $104_{1,1}$-$104_{m,n}$ are arranged within an RRAM array 102 comprising rows and/or columns. RRAM cells (e.g., $104_{1,1}$-$104_{1,n}$) within a row of the RRAM array 102 are operably coupled to a word-line $WL_1$-$WL_m$, while RRAM cells (e.g., $104_{1,1}$-$104_{m,1}$) within a column of the RRAM array 102 are operably coupled to a bit-line $BL_1$-$BL_n$. For example, RRAM cell $104_{1,1}$ is coupled to bit-line $BL_1$ and word-line $WL_1$, while RRAM cell $104_{2,3}$ is coupled to bit-line $BL_3$ and word-line $WL_2$. This causes the plurality of RRAM cells $104_{1,1}$-$104_{m,n}$ to be respectively associated with an address defined by an intersection of a word-line and bit-line. In some embodiments, each RRAM address may be linked to an assigned data input/output pin on an integrated chip comprising the RRAM circuit 100.

The RRAM array 102 is coupled to support circuitry that is configured to read data from and/or write electronic data to the plurality of RRAM cells $104_{1,1}$-$104_{m,n}$. In some embodiments, the support circuitry comprises a bit-line decoder 106 and a word-line decoder 108. The bit-line decoder 106 is configured to selectively apply a signal (e.g., a current and/or voltage) to one or more of the plurality of bit-lines $BL_1$-$BL_n$ based upon a received address $S_{ADDR}$. The word-line decoder 108 is configured to selectively apply a signal (e.g., a current and/or voltage) to one or more of the plurality of word-lines $WL_1$-$WL_m$ based upon the received address $S_{ADDR}$.

The bit-lines $BL_1$-$BL_n$ of the RRAM array 102 are also operably coupled to a sensing circuitry 110 and a current limiting element 112. The sensing circuitry 110 is configured to sense a data state of a selected one of the plurality of RRAM cells $104_{1,1}$-$104_{m,n}$. For example, to read data from RRAM cell $104_{1,1}$, the word-line decoder 104 and the bit-line decoder 106 selectively apply signals (e.g., voltages) to the RRAM cell $104_{1,1}$, which cause the sensing circuitry 110 to receive a signal (e.g., voltage) having a value that is dependent upon a data state of the RRAM cell $104_{1,1}$. The sensing circuitry 110 is configured to sense this signal and to determine the data state of the RRAM cell $104_{1,1}$ based on the signal (e.g., by comparing the voltage to a reference voltage).

Figure 3:
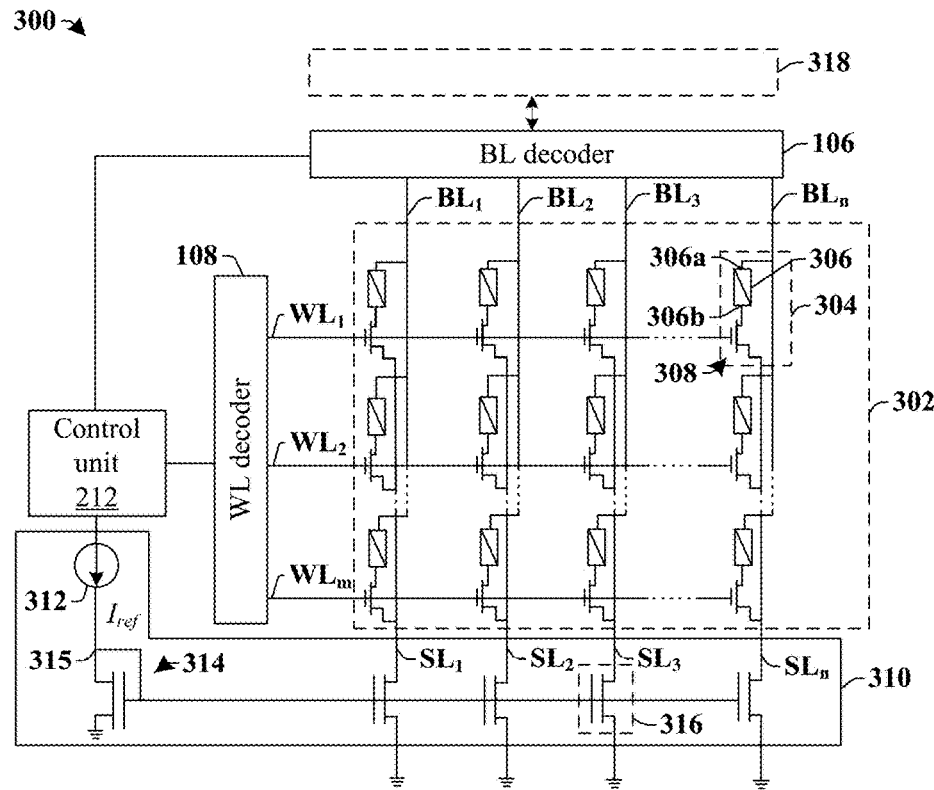
FIG. 3 illustrates some additional embodiments of a block diagram of a RRAM circuit comprising a current limiting element configured to improve forming time.

The current limiting element 112 is configured to selectively limit a current on multiple ones (e.g., all) of the plurality of bit-lines $BL_1$-$BL_n$ during forming operations (i.e., initially forming a conductive filament within RRAM devices). In some embodiments, the current limiting element 112 may be coupled to the plurality of RRAM cells $104_{1,1}$-$104_m$ by way of the plurality of bit-lines $BL_1$-$BL_n$. In other embodiments, the current limiting element 112 may be coupled to the plurality of RRAM cells $104_{1,1}$-$104_m$ by way of source-lines (as shown in FIG. 3).

In some embodiments, the current limiting element 112 may limit the current on the plurality of bit-lines $BL_1$-$BL_n$ to below a forming value (e.g., a pre-determined value that is smaller than a current used during a write operation (set or reset operation)). In some embodiments, the current limiting element 112 may be configured to limit the current on the plurality of bit-lines $BL_1$-$BL_n$ during a forming operation without limiting the current on the plurality of bit-lines $BL_1$-$BL_n$ during a read operation or a write operation. By using the current limiting element 112 to limit the current on the bit-lines during the forming operations, a forming signal can concurrently be applied to multiple bit-lines $BL_1$-$BL_n$ (e.g., to all of the RRAM cells $104_{1,1}$-$104_{m,n}$ within a row) while consuming a relatively low overall current. This allows for the forming operation to be performed quickly and accurately.

Figure 2:
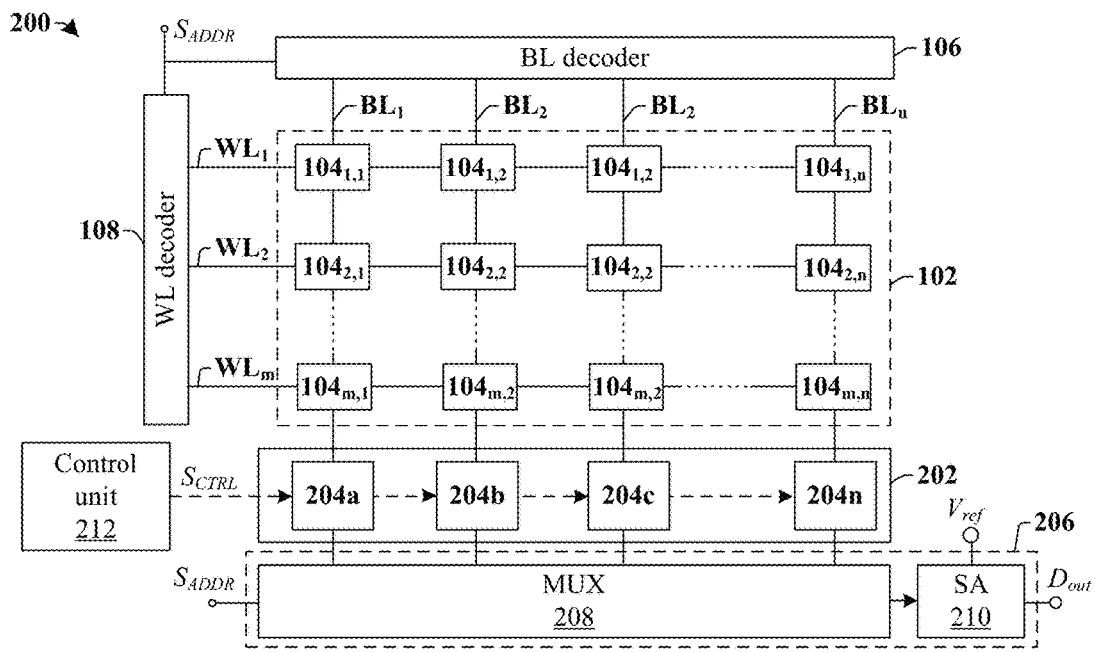
FIG. 2 illustrates some additional embodiments of a block diagram of a RRAM circuit comprising a current limiting element configured to improve forming time.

FIG. 2 illustrates some additional embodiments of a block diagram of a RRAM circuit 200 comprising a current limiting element configured to improve forming time.

The RRAM circuit 200 comprises a current limiting element 202 operably coupled to a plurality of bit-lines $BL_1$-$BL_n$. In some embodiments, the current limiting element 202 comprises a plurality of current limiting components 204a-204n, which are respectively coupled to one of the plurality of bit-lines $BL_1$-$BL_n$. The current limiting components 204a-204n are configured to limit a current that is on a respective one of the plurality of bit-lines $BL_1$-$BL_n$ to below a forming value. In some embodiments, the forming value may have a value that is in a range of between approximately 1 µA and approximately 5 µA. In other embodiments, the forming value may have other values.

A sensing circuitry 206 is configured to determine a data state within RRAM cells $104_{1,1}$-$104_{m,n}$ within the RRAM array 102. In some embodiments, the sensing circuitry 206 is separated from the RRAM array 102 by the current limiting element 202. In other embodiments, the sensing circuitry 206 may be separated from the RRAM array 102 by the bit-line decoder 106. In some embodiments, the sensing circuitry 206 may comprise a multiplexer 208 and a sense amplifier 210. During read operations, the multiplexer 208 is configured to receive signals from one or more of the plurality of bit-lines $BL_1$-$BL_n$ and to selectively provide a signal to a sense amplifier 210. The sense amplifier 210 is configured to compare the received signal to a reference voltage $V_{ref}$ to generate an output data state $D_{out}$ (e.g., a '1' or a '0') corresponding to a data state stored in a selected RRAM cell.

In some embodiments, a control unit 212 is coupled to the current limiting element 202. The control unit 212 is configured to output a control signal $S_{CTRL}$ that selectively operates the current limiting components 204a-204n to limit a current within the plurality of bit-lines $BL_1$-$BL_n$ during a forming operation. In some embodiments, the current limiting components 204a-204n are configured to receive a same control signal $S_{CTRL}$, so that the current limiting components 204a-204n concurrently limit currents on the plurality of bit-lines $BL_1$-$BL_n$ (e.g., on all of the plurality of bit-lines $BL_1$-$BL_n$) during a forming operation. In some embodiments, the control unit 212 is configured to operate the current limiting components 204a-204n to not limit the current on the plurality of bit-lines $BL_1$-$BL_n$ during read and/or write operations on the RRAM array 102. For example, in various embodiments, the current limiting element 202 may be decoupled from the plurality of bit-lines $BL_1$-$BL_n$ and/or turned off during read operations and/or write operations.

In various embodiments, the current limiting components 204a-204n may comprise any type of device configured to selectively limit the current on the plurality of bit-lines $BL_1$-$BL_n$. For example, in some embodiments, the current limiting components 204a-204n may comprise variable resistors. In such embodiments, the resistance of the variable resistors limits the current on the plurality of bit-lines $BL_1$-$BL_n$ (since according to Ohm's law, voltage is equal to current multiplied by resistance). In other embodiments, the current limiting components 204a-204n may comprise transistors.

FIG. 3 illustrates some additional embodiments of a block diagram of a RRAM circuit 300 comprising a current limiting element configured to improve forming time.

The RRAM circuit 300 comprises a plurality of RRAM cells 304 arranged within an RRAM array 302. The plurality of RRAM cells 304 respectively comprise an RRAM device 306 and an access transistor 308. The RRAM device 306 has a first electrode 306a connected to a bit-line $BL_1$-$BL_n$ and a second electrode 306b connected to a source terminal of the access transistor 308. The access transistor 308 has a gate terminal coupled to a word-line $WL_1$-$WL_n$, so that the bit-lines $BL_1$-$BL_n$ and word-lines $WL_1$-$WL_n$ are configured to collectively provide access to an RRAM cell 304. The access transistor 308 further comprises a drain terminal that is coupled to one of a plurality of source-lines $SL_1$-$SL_n$.

The plurality of source-lines $SL_1$-$SL_n$ are further coupled to a current limiting element 310. In some embodiments, the current limiting element 310 comprises a current source 312 configured to generate a reference current $I_{ref}$. The current source 312 is connected to a control unit 212 that is configured to control a value of the reference current $I_{ref}$. The reference current $I_{ref}$ is provided from the current source 312 to the source terminal of a diode connected transistor 314. The diode connected transistor 314 further comprises a drain terminal coupled to a ground terminal and gate terminal coupled to the source terminal. The reference current $I_{ref}$ is also provided from the current source 312 to a plurality of current limiting components within the current limiting element 310. In some embodiments, the plurality of current limiting components comprise transistor devices 316.

During operation, the control unit 212 is configured to operate the current source 312 to output the reference current $I_{ref}$. The diode connected transistor 314 is configured to convert the reference current $I_{ref}$ to a bias voltage at node 315. Because the conductance across a channel of the transistor devices 316 (i.e., between the source terminal and drain terminal) is different for different value of gate bias, the transistors devices 316 are able to act as a variable resistor, where the resistance value is controlled by the voltage at node 315.

In some embodiments, a sensing circuitry 318 may be configured to read data by way of the bit-lines $BL_1$-$BL_n$. In such embodiments, the transistor devices 316 respectively have a gate terminal connected to the current source 312, a source terminal connected to the source-lines $SL_1$-$SL_n$, and a drain terminal connected a ground terminal, so that during a read operation of an RRAM array 302 the sensing circuitry 318 may read a value of an RRAM cell from the bit-line by coupling a source-line $SL_1$-$SL_n$ to the ground terminal. In some embodiments, the sensing circuitry 318 may share one or more components with the bit-line decoder 106.

Figure 4A:
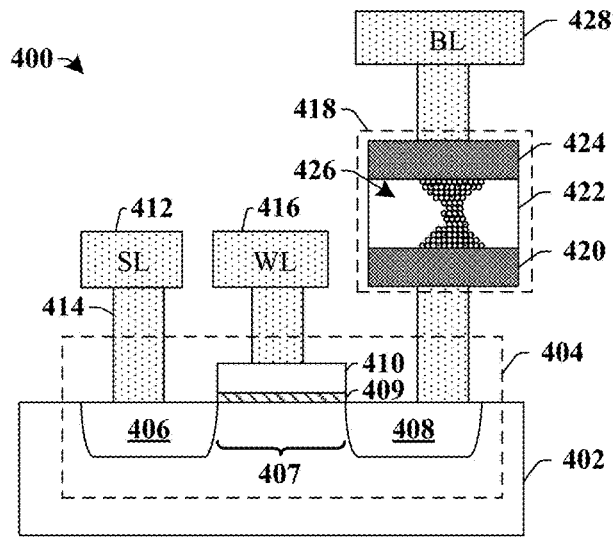
FIGS. 4A-4B illustrate some embodiments of cross-sectional and schematic views of an RRAM cell.

FIG. 4A illustrates some embodiments of cross-sectional view of an RRAM cell 400.

The RRAM cell 400 comprises an RRAM device 418 arranged over a substrate 402. In various embodiments, the substrate 402 may comprise any type of semiconductor body (e.g., silicon, SiGe, SOI) such as a semiconductor wafer and/or one or more die on a wafer, as well as any other type of metal layer, device, semiconductor and/or epitaxial layers, etc., associated therewith. In some embodiments, the substrate 402 may comprise an intrinsically doped semiconductor substrate having a first doping type (e.g., an n-type doping or a p-type doping).

A transistor device 404 is arranged within the substrate 402. The transistor device 404 includes a source region 406 and a drain region 408 separated by a channel region 407. The transistor device 404 also comprises a gate electrode 410 separated from the channel region 407 by a gate dielectric 409. The source region 406 is coupled to a source-line 412 by way of one or more metal interconnect layers 414 (e.g., a metal wire, a metal via, and/or a conductive contact). The gate electrode 410 is coupled to a word-line 416 by way of one or more metal interconnect layers 414. The drain region 408 is coupled to a bottom electrode 420 of the RRAM device 418 by way of one or more metal interconnect layers 414.

The bottom electrode 420 of the RRAM device 418 is separated from an upper electrode 424 by way of a layer of dielectric material 422. A conductive filament 426, comprising a chain of oxygen vacancies, may extend through the layer of dielectric material 422 after a forming operation has been performed on the RRAM device 418. An upper metal via further couples the upper electrode 424 of the RRAM device 418 to a bit-line 428 formed within a metal interconnect layer overlying the RRAM device 418. In various embodiments, the bottom electrode 420 and the upper electrode 424 may comprise a conductive material such as platinum (Pt), aluminum-copper (AlCu), titanium nitride (TiN), gold (Au), titanium (Ti), tantalum (Ta), tantalum nitride (TaN), tungsten (W), tungsten nitride (WN), and/or copper (Cu), for example. In various embodiments, the layer of dielectric material 422 may comprise nickel oxide (NiO), titanium oxide (TiO), hafnium oxide (HfO), zirconium oxide (ZrO), zinc oxide (ZnO), tungsten oxide ($WO_3$), aluminum oxide ($Al_2O_3$), tantalum oxide (TaO), molybdenum oxide (MoO), and/or copper oxide (CuO), for example.

Although RRAM cell 400 is illustrates as having a 1T1R (one transistor, one resistor) RRAM device structure, it will be appreciated that in other embodiments the disclosed RRAM circuit can be applied with other RRAM device structures (e.g., a 2T2R). Furthermore, the source-line 412, word-line 416, and bit-line 428 can be located in different layers than shown in this example.

Figure 4B:
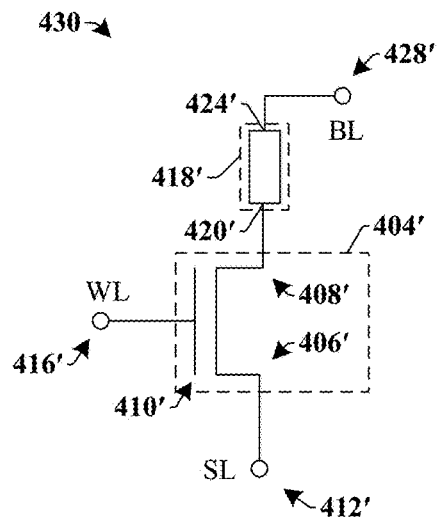

FIG. 4B illustrates a schematic diagram 430 of RRAM cell 400. As shown in schematic diagram 430, the word-line 416' is coupled to a gate terminal 410' of transistor 404'. The transistor 404' comprises a source terminal 406' coupled to a source-line 412' and a drain terminal 408' to coupled to a first electrode 420' of RRAM cell 418'. A second electrode 424' of the RRAM cell 418' is coupled to a bit-line 428'.

Figure 5:
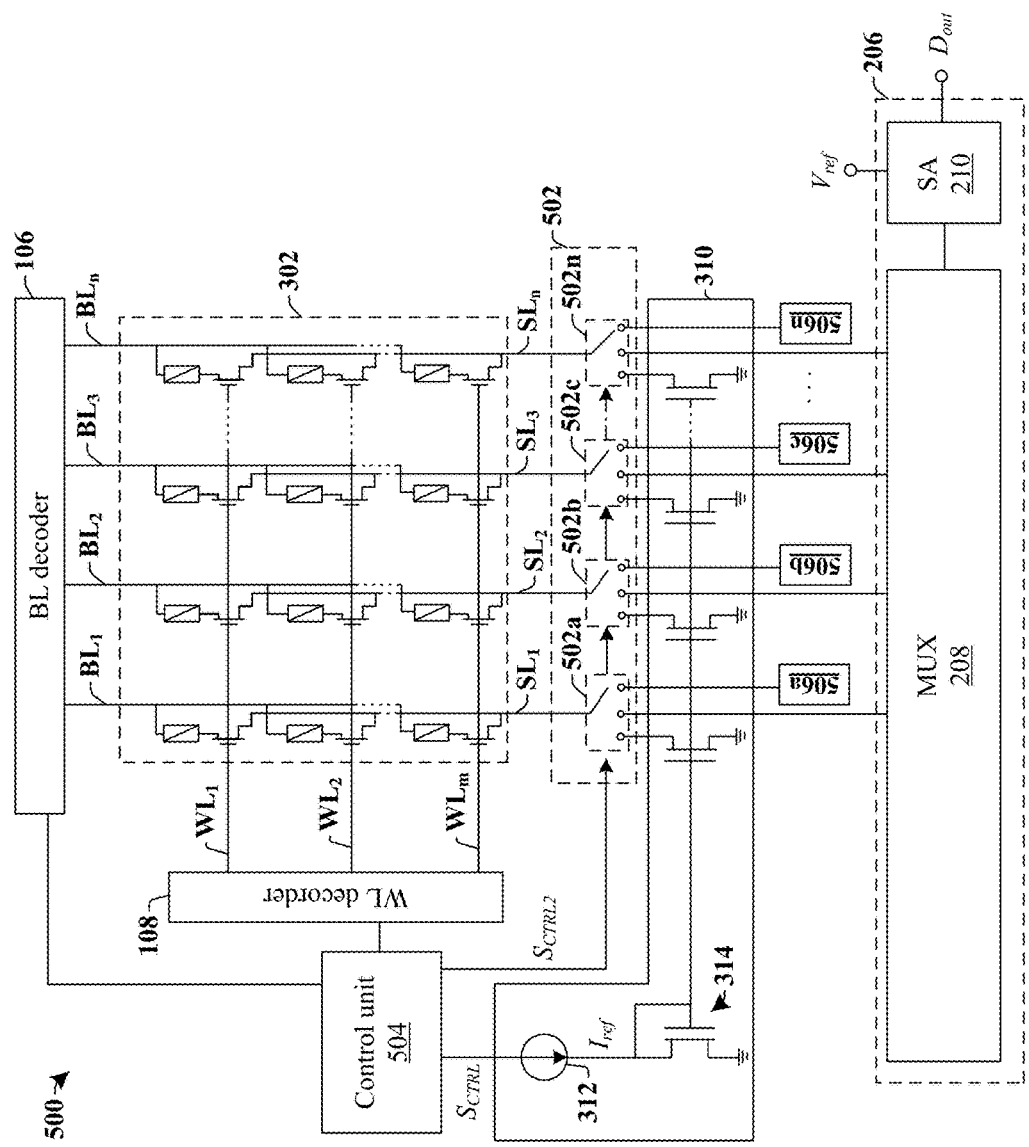
FIG. 5 illustrates some additional embodiments of a block diagram of a RRAM circuit comprising a current limiting element configured to improve forming time.

FIG. 5 illustrates some additional embodiments of a block diagram of a RRAM circuit 500 comprising a current limiting element configured to improve forming time.

The RRAM circuit 500 comprises a plurality of source-lines $SL_1$-$SL_n$ respectively coupled to a column of RRAM cells within an RRAM array 302. The plurality of source-lines $SL_1$-$SL_n$ are further coupled to a switching element 502. The switching element 502 is configured to selectively couple the plurality of source-lines $SL_1$-$SL_n$ to a current limiting element 310 during a forming operation. The current limiting element 310 is configured to limit currents on a plurality of bit-lines $BL_1$-$BL_n$ during the forming operation.

In some embodiments, the switching element 502 is configured to selectively couple the plurality of source-lines $SL_1$-$SL_n$ to a sensing circuitry 206, comprising a multiplexer 208 and a sense amplifier 210, during a read operation. In such embodiments, the multiplexer 208 is configured to selectively provide an output of one of the plurality of bit-lines $BL_1$-$BL_n$ associated with an accessed RRAM cell to the sense amplifier 210 during the read operation. In some embodiments, a load (e.g., resistor) may be arranged between the multiplexer 208 and the sense amplifier 210 to convert a current output of one of the plurality of bit-lines $BL_1$-$BL_n$ to a voltage. The sense amplifier 210 may comprises a pair of cross-coupled inverters configured to compare an output of the multiplexer 208 to a reference voltage $V_{ref}$ to determine a data state stored in the accessed RRAM cell.

In other embodiments (not shown), the RRAM circuit 500 may be configured to read data from the RRAM array 302 by way of the plurality of bit-lines $BL_1$-$BL_n$. In some such embodiments, a sensing circuitry is separated from the RRAM array 302 by the bit-line decoder 106. To enable the sensing circuitry to read data from the plurality of bit-lines $BL_1$-$BL_n$, the switching element 502 may be configured to selectively couple the plurality of source-lines $SL_1$-$SL_n$ to a ground terminal during the read operation.

In some embodiments, the RRAM circuit 500 may further comprise a plurality of additional current limiting elements 506a-506n. In such embodiments, the switching element 502 is configured to selectively couple the plurality of source-lines $SL_1$-$SL_n$ to the plurality of additional current limiting elements 506a-506n during a write operation. The additional current limiting elements 506a-506n are configured to independently limit currents on respective ones of the plurality of bit-lines $BL_1$-$BL_n$ during the write operations (e.g., during set and/or reset operations). For example, the additional current limiting elements 506a-506n my comprise a first current limiting element 506a configured to limit a current on a first bit-line $BL_1$ without limiting a current on a second bit-line $BL_2$, and a second current limiting element 506b configured to limit a current on a second bit-line $BL_2$ without limiting a current on the first bit-line $BL_1$. In some embodiments, the plurality of additional current limiting elements 506a-506n are configured to limit the current on the plurality of bit-lines $BL_1$-$BL_n$ during a write operation to a first value that is greater than a value to which the current limiting element 310 is configured to limit a current on the plurality of bit-lines $BL_1$-$BL_n$ during a forming operation.

A control unit 504 may be coupled to the switching element 502. The control unit 504 is configured to generate a second control signal $S_{CTRL2}$ that controls operation of a plurality of switches 502a-502n within the switching element 502 in conjunction with the bit-line decoder 106 and the word-line decoder 108 and/or the current limiting element 310. For example, during a forming operation, the control unit 504 is configured to operate the bit-line decoder 106 to apply a forming voltage to a plurality of bit-lines $BL_1$-$BL_n$, and to concurrently operate the plurality of switching elements 502a-502n to couple the plurality of source-lines $SL_1$-$SL_n$ to the current limiting element 310. During a read operation, the control unit 504 is configured to operate the bit-line decoder 106 to apply a read voltage, which is smaller than the forming voltage, to one of the plurality of bit-lines $BL_1$-$BL_n$ and to concurrently operate the plurality of switches 502a-502n to couple the plurality of source-lines $SL_1$-$SL_n$ to the sensing circuitry 206. During a write operation, the control unit 504 is configured to operate the bit-line decoder 106 to apply a write voltage, which is smaller than the forming voltage, to one of the plurality of bit-lines $BL_1$-$BL_n$ and to concurrently operate the plurality of switches 502a-502n to couple the plurality of source-lines $SL_1$-$SL_n$ to the additional current limiting elements 506a-506n.

Figure 6B:
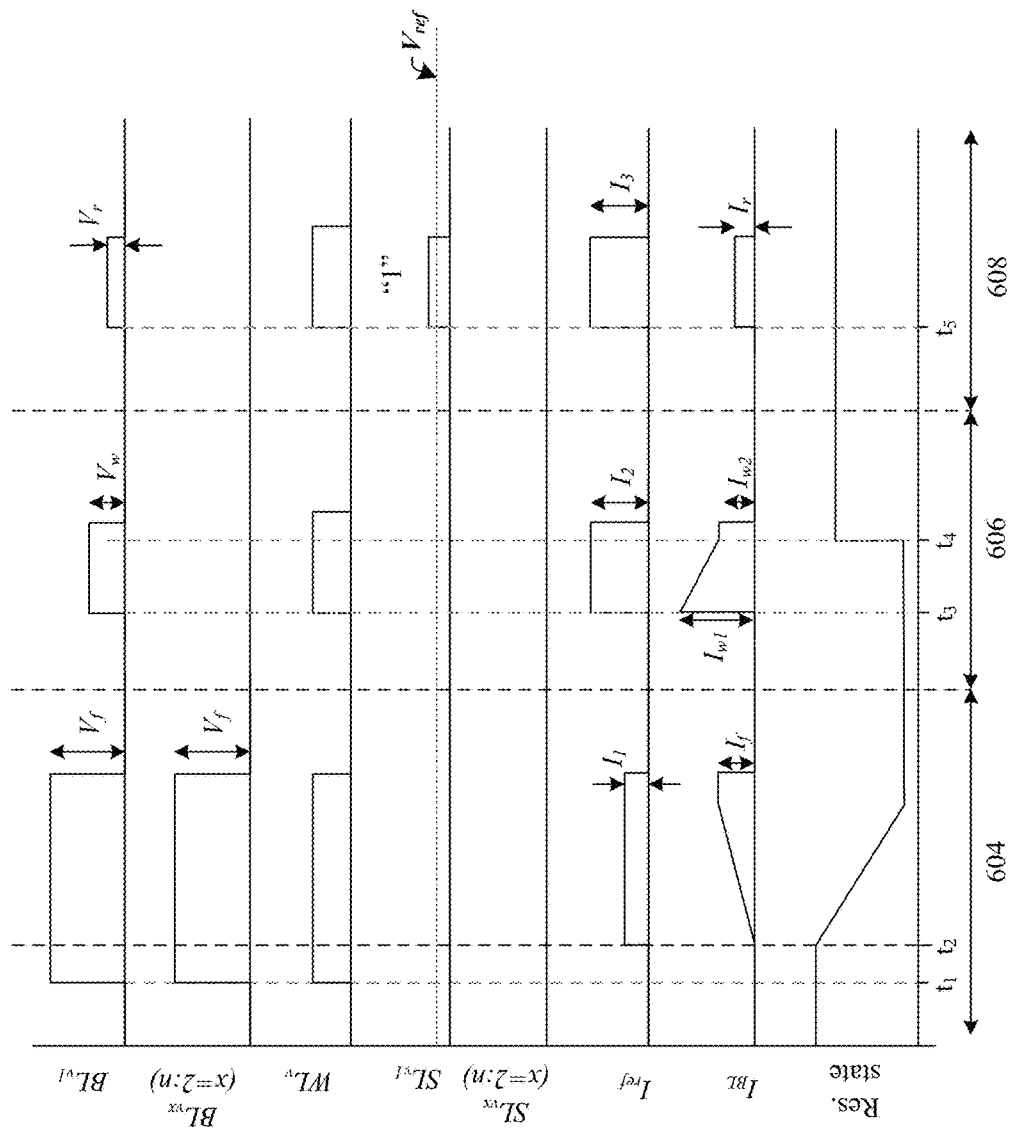

FIGS. 6A-6B illustrate a block diagram 600 and a timing diagram 602 of some embodiments of a method of operating an RRAM array with a disclosed current limiting element.

As shown in block diagram 600 and in timing diagram 602, during a forming operation 604 a bit-line voltage $BL_{vx}$ (v=1-n) having a forming voltage value $V_f$ is applied to the plurality of bit-lines $BL_1$-$BL_n$ at time $t_1$. Since there is no existing filament in an RRAM device, initially forming the filament requires a higher voltage than subsequent write operations (e.g., once the filament is formed, it may be subsequently reset (broken, resulting in high resistance) or set (re-formed, resulting in lower resistance) to store data states using a lower voltage). At time $t_1$, one word-line $WL_x$ (where x=1, 2, . . . or n) of a plurality of word-lines $WL_x$ (where x=1-n) is also activated (while the other remaining ones of the plurality of word-lines are not activated) to form a conductive path between a plurality of RRAM devices 306 within a row of RRAM array 302 and a plurality of source-lines $SL_1$-$SL_n$. The plurality of source-lines $SL_1$-$SL_n$ are held at a low source-line voltage $SL_{vx}$ (e.g., $V_{DD}$) so as to form a large voltage difference between electrodes, 306a and 306b, of the RRAM devices 306. The large voltage difference drives current through a layer of dielectric material within the RRAM device, causing an initial filament to be formed within the plurality of RRAM devices 306 at a time $t_2$ (e.g., by generating thermal energy and/or an electromagnetic force that causes oxygen vacancy migration in the dielectric layer by moving ions from a layer of dielectric material layer to a conductive filament).

The current source 312 is configured to output a reference current $I_{ref}$ having a first current value $I_1$ at time $t_1$. The first current value $I_1$ causes the reference current $I_{ref}$ to bias the transistor devices 316 within current limiting element 310 to limit a bit-line current $I_{BL}$ on the plurality of bit-lines $BL_1$-$BL_n$ to below a forming value $I_f$. The bit-line current $I_{BL}$ increases over time as a resistance of the RRAM cell decreases (as the initial filament is formed).

During a write operation 606, data can be written to one or more of the plurality of RRAM devices 306. Data is written to one or more of the plurality of RRAM devices 306 by applying a bit-line voltage $BL_{vx}$ (v=1-n) having a write voltage value $V_w$ to one bit-line $BL_x$ (where x=1, 2, . . . or n) of the plurality of bit-lines $BL_1$-$BL_n$ at time $t_3$, while the other bit-lines of the plurality of bit-lines $BL_1$-$BL_n$ may be held at 0V. The plurality of source-lines $SL_1$-$SL_n$ are held at a low source-line voltage $SL_{vx}$ (e.g., $V_{DD}$) so as to form a potential difference between electrodes, 306a and 306b, of the RRAM device 306 and to force current through the layer of dielectric material (resulting in a reaction that changes the conductive filament). At time $t_3$, one word-line $WL_x$ (where x=1, 2, . . . or n) of a plurality of word-lines $WL_x$ (where x=1-n) is also activated to form a conductive path between one of the plurality of RRAM devices 306 and one of the plurality of source-lines $SL_1$-$SL_n$ In various embodiments, the write operation may be a set operation (not shown) configured to form a conductive filament between conductive electrodes of an RRAM device resulting in a low resistive state or a reset operation (shown) configured to break a conductive filament between electrodes, 306a and 306b, of an RRAM device 306 resulting in a high resistive state. In some embodiments, the write voltage value $V_w$ may be smaller than the forming voltage value $V_f$. For example, the write voltage value $V_w$ may have a value in a range of between approximately 0.5V and approximately 4V, while the forming voltage value $V_f$ may have a value in a range of between approximately 2V and approximately 10V. In some embodiments, the write voltage $V_w$ may be greater for the set operation than for the reset operation.

In some embodiments, the current source 312 may be configured to output a reference current $I_{ref}$ having a second value $I_2$, at time $t_3$. The second current value $I_2$ causes the reference current $I_{ref}$ to bias the transistor devices 316 within the current limiting element 310 to cause a bit-line current $I_{BL}$ on one of the plurality of bit-lines $BL_1$-$BL_n$ to have an initial write current value $I_{w1}$ that is different (e.g., greater) than the forming value $I_f$. For example, in some embodiments, the reference current $I_{ref}$ biases the transistor devices 316 within the current limiting element 310 to not substantially limit a current on one of the plurality of bit-lines $BL_1$-$BL_n$, so that an initial write current value $I_{w1}$ is greater than the forming value $I_f$. The write current value decreases from an initial write current value $I_{w1}$ to a second write current value $I_{w2}$ as a resistance of the RRAM cell increases (as the filament is broken).

During a read operation 608, data can be read from one or more of the plurality of RRAM devices 306. Data is read from one or more of the plurality of RRAM devices 306 by applying a bit-line voltage $BL_{vx}$ (v=1-n) having a read voltage value $V_r$ to one bit-line $BL_x$ (where x=1, 2, ... or n) of the plurality of bit-lines $BL_1$-$BL_n$, at time $t_5$, while the other bit-lines of the plurality of bit-lines $BL_1$-$BL_n$ may be held at 0V. In some embodiments, the read voltage value $V_r$ may be smaller than the write voltage value $V_w$. For example, the read voltage value $V_r$ may have a value in a range of between approximately 1V and approximately 2V. The read voltage value $V_r$ may have a value that is smaller than a threshold voltage of the RRAM device, so as to prevent unintentionally overwriting data stored within the RRAM device.

In some embodiments, the current source 312 is configured to output a reference current $I_{ref}$ having a third current value $I_3$. The third current value $I_3$ causes the reference current $I_{ref}$ to bias the transistor devices 316 within the current limiting element 310 to cause a bit-line current $I_{BL}$ on one of the plurality of bit-lines $BL_1$-$BL_n$ having read current value $I_r$ that is different (e.g., smaller) than the forming value $I_f$. If the source-line voltage $SL_{vx}$ is greater than a reference voltage $V_{ref}$, the resulting data state is a "1", while if the source-line voltage $SL_{vx}$ is less than the reference voltage $V_{ref}$, the resulting data state is a "0".

FIG. 7 illustrates a flow diagram of some embodiments of a method 700 of performing a forming operation of an RRAM array.

While the disclosed method 700 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 702, a word-line operably coupled to a row of RRAM devices is activated. In some embodiments, the word-line may be coupled to a row of RRAM devices by a plurality of access transistors.

At 704, a forming voltage is applied to a plurality of bit-lines coupled to first electrodes of the row of RRAM devices. In some embodiments, the forming voltage is applied to all of the bit-lines in an RRAM array comprising the RRAM devices.

At 706, a current on the plurality of bit-lines is limited to below a forming value during a forming operation that forms initial conductive filaments within the RRAM devices. In some embodiments, the current limiting element is operated to limit the current on the plurality of bit lines by applying a bias signal to gate of a transistor devices connected to source-lines coupled to second electrode of the row of RRAM devices, at 708.

At 710, a second voltage is applied to a plurality of source-lines coupled to second electrodes of the row of RRAM devices to form the initial conductive filaments within the RRAM devices within the row of RRAM devices. In some embodiments, the second voltage may be ground.

Therefore, the present disclosure relates to a resistive random access memory (RRAM) circuit comprising a current limiting element configured to improve a forming time of an RRAM array by limiting a current on a plurality of bit-lines and thereby allowing forming to concurrently occur on RRAM devices coupled to the plurality of bit-lines, and an associated method.

In some embodiments, the present disclosure relates to a resistive random access memory (RRAM) circuit. The RRAM circuit comprises a plurality of RRAM cells, which respectively comprising an RRAM device. A bit-line decoder is configured to concurrently apply a forming signal to a plurality of bit-lines coupled to two or more of the plurality of RRAM cells. A current limiting element is configured to concurrently limit a current on the plurality of bit-lines to below a forming value during a forming operation that forms an initial conductive filament within the RRAM device.

In other embodiments, the present disclosure relates a resistive random access memory (RRAM) circuit. The RRAM circuit comprises a plurality of RRAM cells, respectively comprising a first electrode coupled to a bit-line and a second electrode coupled to a source-line by way of an access transistor. A bit-line decoder is configured to concurrently apply a forming signal to a plurality of bit-lines coupled to two or more of the plurality of RRAM cells during a forming operation. A current limiting element is configured to limit currents on the plurality of bit-lines to a smaller current value during the forming operation than during a write operation.

In yet other embodiments, the present disclosure relates to a method of performing a forming operation on an RRAM circuit. The method comprises activating a word-line operably coupled to a row of RRAM cells within an RRAM array. The method further comprises concurrently applying a forming signal to a plurality of bit-lines coupled to a plurality of RRAM cells within the row of RRAM cells to perform a forming operation that forms initial conductive filaments within the plurality of RRAM cells. The method further comprises concurrently limiting a current on the plurality of bit-lines to below a forming value during the forming operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A resistive random access memory (RRAM) circuit, comprising:
   a plurality of RRAM cells;
   a plurality of bit-lines coupled to the plurality of RRAM cells;
   a bit-line decoder configured to concurrently apply a forming signal to the plurality of RRAM cells, wherein the bit-line decoder is configured to apply a write voltage to the plurality of bit-lines that is smaller than a voltage used to apply the forming signal; and
   a current limiting element configured to concurrently limit a current of the forming signal applied to the plurality of RRAM cells, which is concurrently applied to the plurality of bit-lines.

2. The RRAM circuit of claim 1, wherein the current limiting element is configured to limit the current of the forming signal to a value that is smaller than a current value used to perform a write operation on one of the plurality of RRAM cells.

3. The RRAM circuit of claim 1, wherein the forming signal is configured to form initial conductive filaments within the plurality of RRAM cells.

4. The RRAM circuit of claim 1, further comprising:
   a word-line operatively coupled to the plurality of RRAM cells by way of separate access transistors.

5. The RRAM circuit of claim 1, further comprising:
   a plurality of source-lines coupled to the plurality of RRAM cells, wherein the current limiting element is coupled to the plurality of RRAM cells by the plurality of source-lines.

6. The RRAM circuit of claim 1, wherein the current limiting element comprises a plurality of discrete current limiting components, which are respectively coupled to one of the plurality of RRAM cells.

7. The RRAM circuit of claim 1, wherein the current limiting element comprises:
   a plurality of transistor devices, wherein respective ones of the plurality of transistor devices are coupled to one of the plurality of RRAM cells; and
   a current source coupled to gate terminals of the plurality of transistor devices.

8. The RRAM circuit of claim 1, further comprising:
   a control unit configured to concurrently operate the current limiting element to limit the current applied to the plurality of RRAM cells and to operate the bit-line decoder to apply the forming signal to the plurality of RRAM cells.

9. The RRAM circuit of claim 8, wherein the control unit is further configured to decouple the current limiting element from the plurality of RRAM cells or to turn off the current limiting element during performance of a read operation and a write operation on one of the plurality of RRAM cells.

10. A resistive random access memory (RRAM) circuit, comprising:
    a plurality of RRAM devices;
    a bit-line decoder coupled to a plurality of bit-lines coupled to the plurality of RRAM devices, wherein the bit-line decoder is configured to concurrently apply a forming signal to the plurality of RRAM devices and the plurality of bit-lines, wherein the bit-line decoder is configured to apply a write voltage to the plurality of bit-lines that is smaller than a voltage used to apply the forming signal; and
    a current limiting element configured to concurrently limit a current of the forming signal on the plurality of bit-lines and the plurality of RRAM devices.

11. The RRAM circuit of claim 10, further comprising:
    a plurality of access transistors respectively having a source terminal coupled to one of the plurality of RRAM devices; and
    a word-line coupled to gate terminals of the plurality of access transistors.

12. The RRAM circuit of claim 10, wherein the current limiting element comprises:
    a plurality of transistor devices, wherein respective ones of the plurality of transistor devices are coupled to one of the plurality of RRAM devices; and
    a diode connected transistor having a source terminal coupled to a current source and a gate terminal coupled to the source terminal and to gate terminals of the plurality of transistor devices.

13. The RRAM circuit of claim 10, further comprising:
    a plurality of source-lines coupled to the plurality of RRAM devices, wherein a first electrode of a first one of the plurality of RRAM devices is coupled to a first one of the plurality of bit-lines and a second electrode of the first one of the plurality of RRAM devices is coupled to a first one of the plurality of source-lines; and
    wherein the current limiting element is coupled to the plurality of RRAM devices by the plurality of source-lines.

14. The RRAM circuit of claim 10, wherein the current limiting element is configured to limit the current of the forming signal applied to the plurality of bit-lines to a value that is smaller than a current value used to perform a write operation on one of the plurality of RRAM devices.

15. A method of operating an RRAM circuit, comprising:
    activating a word-line coupled to a row of RRAM cells within an RRAM array;
    concurrently applying a forming signal to a plurality of bit-lines coupled to a plurality of RRAM cells within the row of RRAM cells, wherein a forming voltage used to apply the forming signal is greater than a write voltage used to perform a write operation on the plurality of bit-lines; and
    concurrently limiting a current of the forming signal applied to the plurality of bit-lines, which is concurrently applied to the plurality of RRAM cells.

16. The method of claim 15, wherein the forming signal forms an initial conductive filaments within the plurality of RRAM cells.

17. The method of claim 15, further comprising:
    decoupling the current limiting element from the plurality of RRAM cells or turning off the current limiting element during performance of a read operation and the write operation on one of the plurality of RRAM cells.

18. The method of claim 15, wherein the current limiting element is configured to limit the current of the forming signal to a value that is smaller than a current value used to perform the write operation on the plurality of RRAM cells.

19. The method of claim 15, further comprising:
    simultaneously applying a second voltage smaller than the forming voltage to a plurality of source-lines, wherein the plurality of bit-lines are coupled to first electrodes of the plurality of RRAM cells, and wherein the plurality of source-lines are coupled to second electrodes of the plurality of RRAM cells.

20. The RRAM circuit of claim 10, further comprising:
one or more additional current limiting elements configured to independently limit a current on one of the plurality of bit-lines during a write operation.

* * * * *